United States Patent
Yen et al.

(10) Patent No.: US 6,306,759 B1
(45) Date of Patent: Oct. 23, 2001

(54) METHOD FOR FORMING SELF-ALIGNED CONTACT WITH LINER

(75) Inventors: Tzu-Shih Yen; Erik S. Jeng; Hsiao-Chin Tuan; Chun-Yao Chen, all of Hsin-Chu; Eddy Chiang, Tao-Yuan; Wen-Shiang Liao, Miao-Li, all of (TW)

(73) Assignee: Vanguard International Semiconductor Corporation (TW)

( * ) Notice: Subject to any disclaimer, the term of this patent is extended or adjusted under 35 U.S.C. 154(b) by 0 days.

(21) Appl. No.: 09/654,928

(22) Filed: Sep. 5, 2000

(51) Int. Cl.[7] .................................................. H01L 21/336
(52) U.S. Cl. ..................... 438/637; 438/639; 438/669; 438/672
(58) Field of Search ..................... 438/639, 592, 438/301, 303

(56) References Cited

U.S. PATENT DOCUMENTS

| | | | |
|---|---|---|---|
| 6,025,255 | * 2/2000 | Chen et al. | 438/595 |
| 6,078,073 | * 6/2000 | Habu et al. | 257/296 |
| 6,103,608 | * 8/2000 | Jen et al. | 438/592 |
| 6,194,784 | * 2/2001 | Parat et al. | 257/774 |
| 6,204,134 | * 3/2001 | Shih | 438/301 |
| 6,228,731 | * 5/2001 | Liaw et al. | 438/303 |

\* cited by examiner

*Primary Examiner*—Amir Zarabian
*Assistant Examiner*—Beth E. Owens (57) ABSTRACT

A method for forming self-aligned contact (SAC) is disclosed to improve device reliability. The method includes forming a dielectric liner over the contact opening before the contact plug is filled in. Optional contact implantation before and after the liner formation can be added to enhance the doping profile of the device.

17 Claims, 8 Drawing Sheets

METHOD FOR FORMING SELF-ALIGNED CONTACT WITH LINER

BACKGROUND OF THE INVENTION

1. Field of the Invention

The present invention relates to the fabrication of integrated circuits, and more particularly to a method for forming self-aligned contacts (SAC) utilizing dielectric liner for device improvement.

2. Description of the Prior Art

DRAM is a major volatile memory. Because the integration requirement of the semiconductor device is increasingly higher, the combination of logic and DRAM is widely applied to wafers, and the bit-line contact and the node contact are both designed to be self-aligned contacts (SAC) so as to reduce the size of the wafer.

Figure 1A:
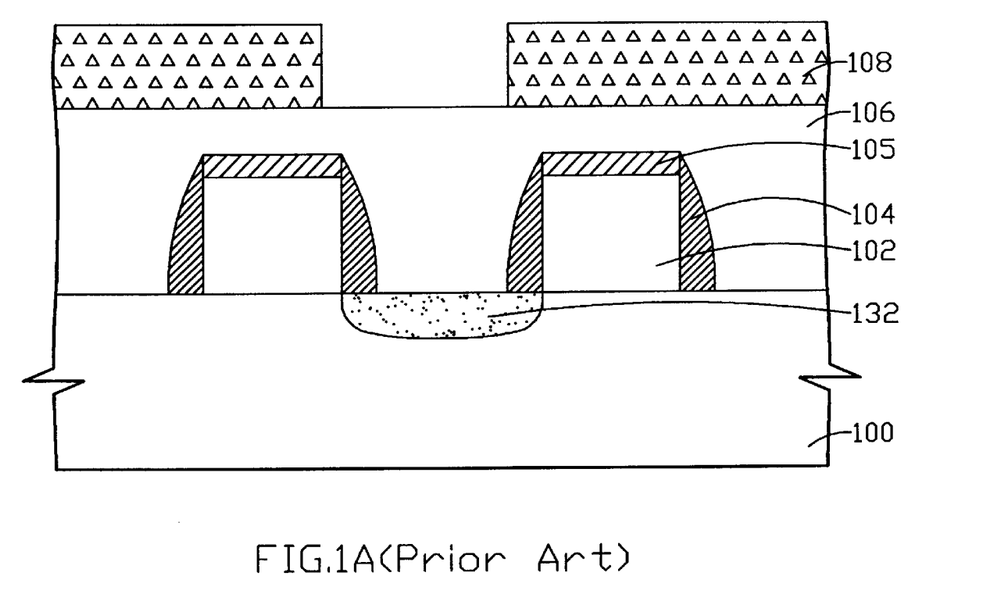
FIGS. 1a through 1c are schematic cross-sectional views showing a sequence of steps for forming self-aligned contact by the prior art.

However, there are several problems associated with the conventional SAC process. These problems are best understood by referring to the prior art shown in FIGS. 1(a) through 1(c) in which a sequence of schematic cross-sectional views is shown of the process steps. As shown in FIG. 1(a), SAC process starts by providing a semiconductor substrate 100 with a plurality of defined poly structures 102 forming thereon. Masking by these structures 102, lightly doped drain (LDD) implantation may then be proceeded onto the substrate 100 to form LDD regions 132. After the implantation, these poly structures 102 seek protection by means of spacer formation. The spacers 104 shown in the figure are constructed typically by depositing a layer of dielectric and then etched to form. Silicon nitride is preferred for use as such spacers for the material possesses reasonably good oxidation resistance. However, other adequate dielectrics may also be chosen. The etching of the spacers is usually done by plasma. In addition to spacer protection, a cap layer 105 is often used to top of the poly 1 structure as an "etch stop". The preferred etch "stop" material currently used for semiconductor fabrication is silicon nitride.

Figure 1B:
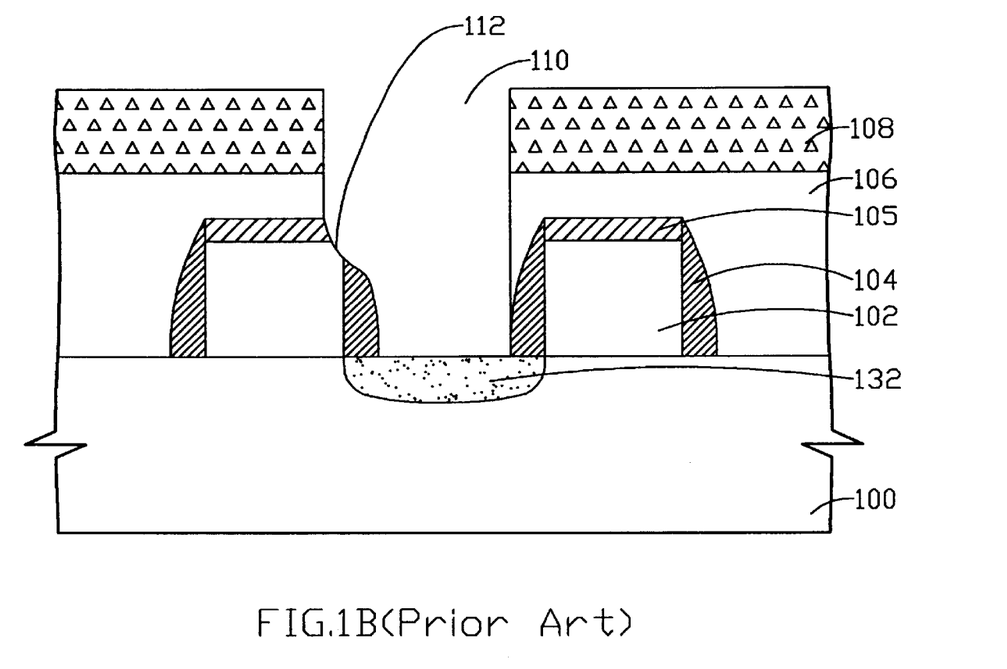

Followed by the spacer (and cap layer) formation, an oxide layer 106 is formed over the substrate 100 by, for example, chemical vapor deposition (CVD). The preferred oxide layer is silicon dioxide, or other oxide such as, BPSG. Next, conventional phtolithographic techniques are applied to pattern the oxide layer 106 and etch open anisotropicly contact openings 110 along the spacers 104 in a self-aligned manner. However, the etch back of the CVD oxide layer 106 to the silicon nitride (spacer 104 and cap 105) is not selective enough to achieve perfect protection of the device, especially at disadvantagous area such as the cap corners which etchants may attack directly. Thus misalignment of the resist 108 patterning often results in comer loss of the protecting nitride (comer of spacer 104 and cap 105) during the contact opening formation, and recess areas such as 112 indicated in FIG. (1b) are often found during the SAC process. Since it is getting more difficult to control pattern aligning and the etching back within the required processing tolerances as the device size keeps on shrinking, the nitride corner loss becomes a major concern for appropriate electrical isolation between contacts and conducting lines lying underneath. In addition, the etching back of the oxide layer 106 is frequently done by plasma. Inevitable substrate damage induced by the plasma etching could raise another issue for the conventional SAC process.

After the etching back of the oxide layer 106, the device is further treated with wet chemical to complete the contact opening formation. Unfortunately, a phenomena called kissing plug is sometimes observed during this step. Since the wet deep process may affect critical dimensions of the structures, the adjacent contacts may be so enlarged that they touch one another and result in possible plug-plug short of the device.

Figure 1C:
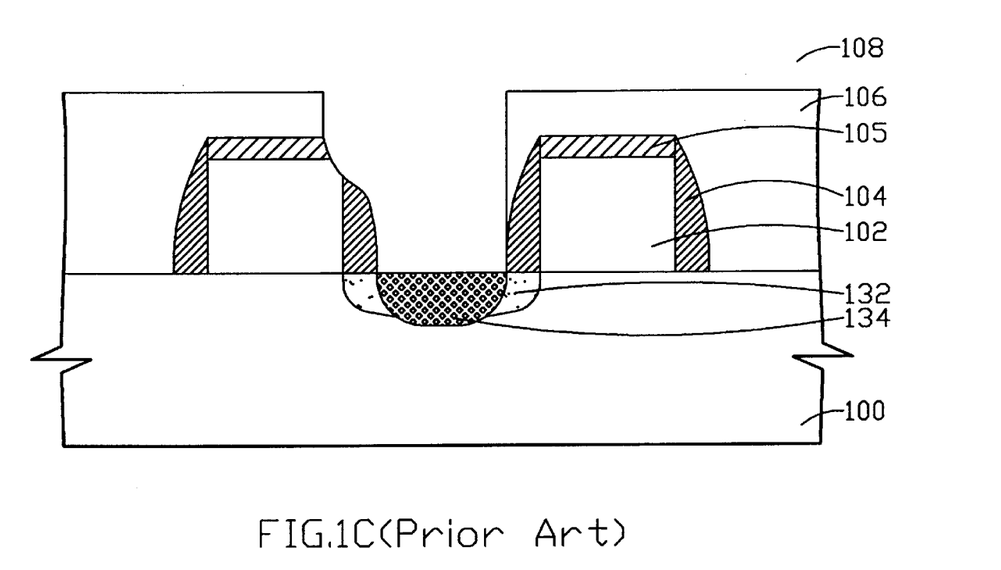

Once the contact openings 110 are formed, the photoresist layer 108, usually made of polymeric material, is stripped off. Then implantation of the substrate 100 may be further done through the contact openings 110 to form doping regions 134. Together with the previously doped LDD regions 132, one resulting implantation profile is illustrated in FIG. 1(c). Finally contact openings 110 are filled with a conductive plug to complete the SAC process.

As the density of DRAM chips progress to giga-bit levels, the area of the DRAM cell decreases to 0.17 micrometers or less. Without modifications of the process, the conventional SAC procedure could cause, by experience, over 90% failure of the product for manufacturing 0.19-micron or less cells. To accommodate the reduced area of the DRAM cell, more aggressive design rules have to be used. Thus there is a strong need to provide an improved method for forming self-aligned contacts.

SUMMARY OF THE INVENTION

In view of the foregoing deficiencies and design considerations, a dielectric liner is utilized to enhance contact insulation so as to improve device reliability. Optional contact implantation before and after the liner formation can be added to further optimize device performance.

In one embodiment, the dielectric liner is formed over a conventional contact opening before the contact plug is filled in. Additional implantation of the substrate is done after the liner formation to enhance the doping profile of the substrate between the adjacent conductive structures. In addition to the liner formation and doping profile enhancement of the device, in another embodiment of the invention, an un-etched dielectric protection layer is used to replace conventional spacers (and the cap layer can then be eliminated) to improve comer strength and provide substrate protection of the device.

The proposed SAC contact process is advantageous over the conventional one. First of all, spacer etching at the cell area can be eliminated so as to reduce possible plasma damages and simplify process steps. Secondly, the presence of a SAC liner reduces the risks of contact CD (critical dimension) gain and possible plug-plug short during post-etching wet chemical treatment. Thirdly, contact implantation can be further treated after contact liner formation to optimize the cell devices. And most important of all, the present invention provides solid SAC contact isolation to adapt required design rules so that product reliability could now catch up with the advancement of device integration.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

It is to be understood and appreciated that the process steps and structures described below do not form a complete process flow for the manufacture of integrated circuits. The present invention can be practiced in conjunction with integrated circuit fabrication techniques that are currently used in the art, and only so much of the commonly practiced process steps are included herein as are necessary to provide an understanding of the present invention. The drawing figures that are included with this specification and which represent cross-sections of portions of an integrated circuit during fabrication are not drawn to scale, but instead are drawn so as to illustrate the relevant features of the invention.

Figure 2A:
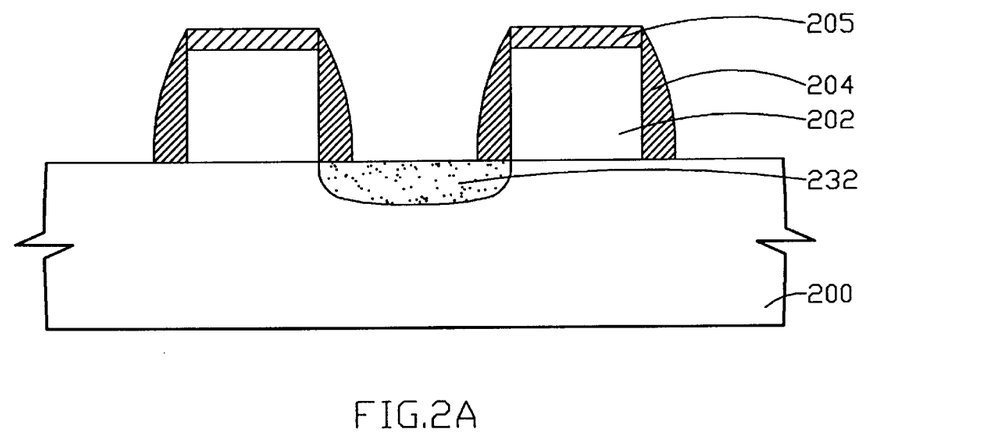
FIGS. 2a through 2e are schematic cross-sectional views showing a sequence of steps for forming self-aligned contact according to one embodiment of the present invention.

FIGS. 2(a) to 2(e) schematically shows consecutive main process steps of a SAC process according one embodiment of the present invention. Referring now to FIG. 2(a), the SAC process starts by providing a semiconductor substrate 200 with a plurality of defined conductive structures 202, such as poly 1 structures, forming thereon. Only two 202 structures are shown in the figures to facilitate the following description. Masking by these structures 202, implantation may then be proceeded onto the substrate 200 to form a first doping region 232. After the implantation, these conductive structures 202 seek protection (isolation and etch stop) by means of spacer 204 and cap layer 205 formation. The preferred protection material used for semiconductor fabrication is silicon nitride. However, other adequate dielectric material may also be chosen.

Figure 2B:
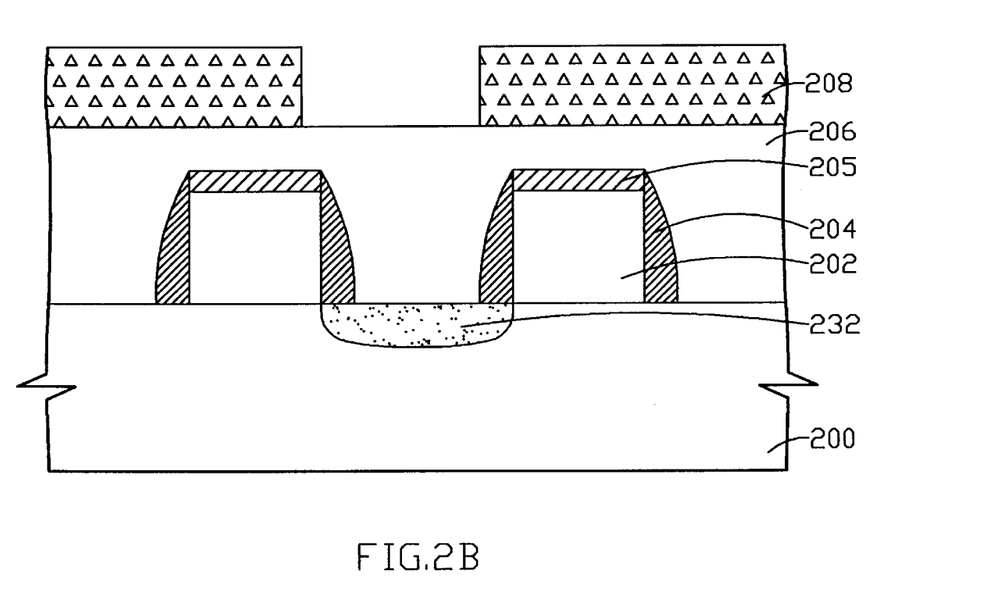
Figure 2C:
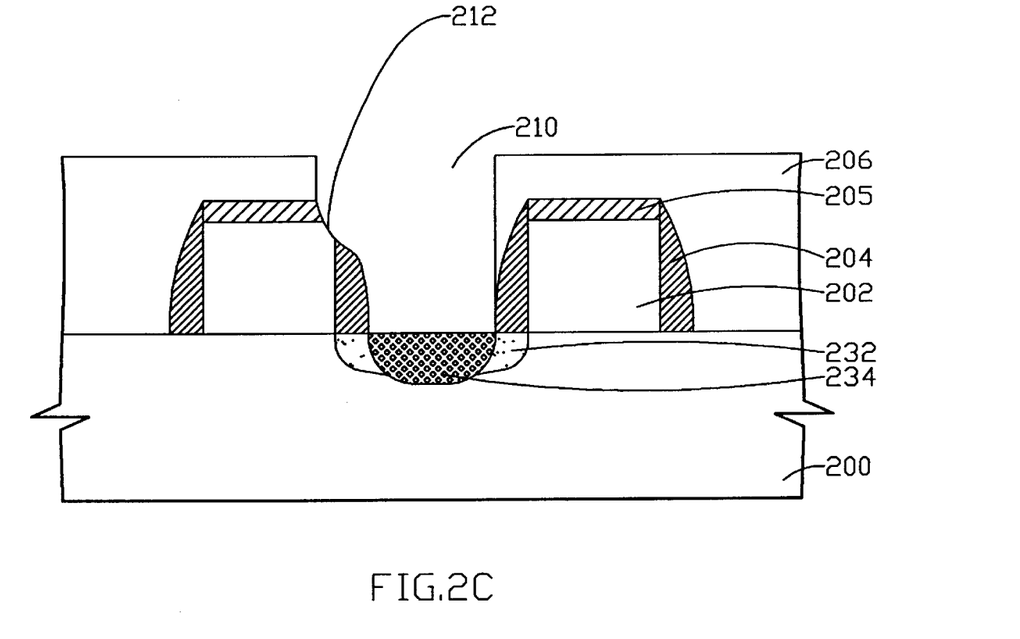

Followed by the spacer and cap layer formation, an oxide layer 206 is formed over the substrate 200, as shown in FIG. (2b). Self aligning to the spacer 204, a contact opening 210 is thus formed by etching back of the oxide layer 206 which is patterned by photoresist layers 208, as shown in FIG. 2(c). Upon completion of the SAC opening formation, the phtoresist layers 208 are now removed. Then implantation of the substrate 200 may be further done through the contact openings 210 overlapping part of the first doping region 232 to form a second doping region 234.

Figure 2D:
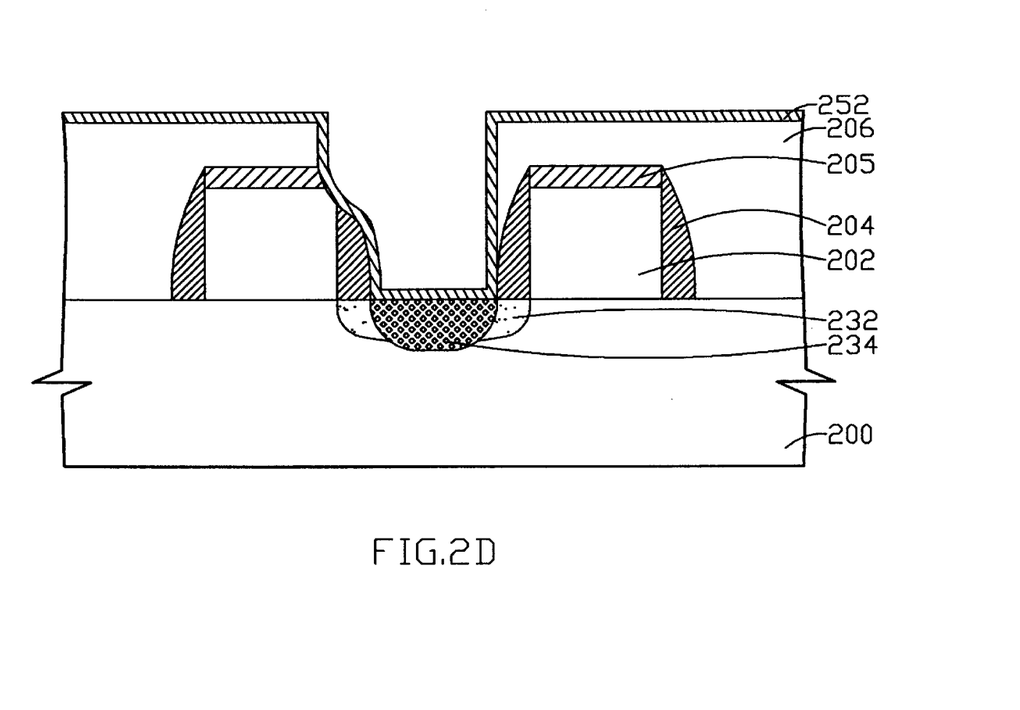

The contact opening 210 is then coated with a conformal layer of dielectric liner 252, as shown in FIG. 2(d). The preferred liner material for the embodiment is silicon nitride, however, there may be other dielectric materials applicable. The dielectric liner 252 is typically deposited by low pressure chemical vapor deposition (LPCVD) to a feasible thickness according to the design requirements. Generally a thickness of about 200 angstroms of the liner 252 for a 17-micron cell would be reasonable. The liner 252 herein provides enhanced electrical isolation to prevent short circuits and thereby ensure proper circuit operation. This is especially important when misalignment of the resist layer 208 is out of the tolerable range and causes serious damages of the protection (spacer 204 and cap 205) layers (for example, corner loss 212). Due to such protection damages, the conductive structures 202 now have the opportunities for exposure and the liner 252 just then fits in to make up the protection loss and thus prevent product failure.

The dielectric liner 252 is then etched back, typically by plasma etching back, to expose the substrate 200 and the top portion of the oxide layer 206. However, the etching should be conducted in such a way that the sidewall of the contact opening is still fully lined with dielectric(s) after the etching. After the etching back of the liner 252, the device is further treated with wet chemical to complete the contact opening formation. Since the contact opening is now protected by the dielectric liner and the liner material such as silicon nitride is highly resistant to such wet treatment, the risk of possible CD (critical dimension) gain is largely reduced and kissing plug phenomenon can thus be avoided.

Figure 2E:
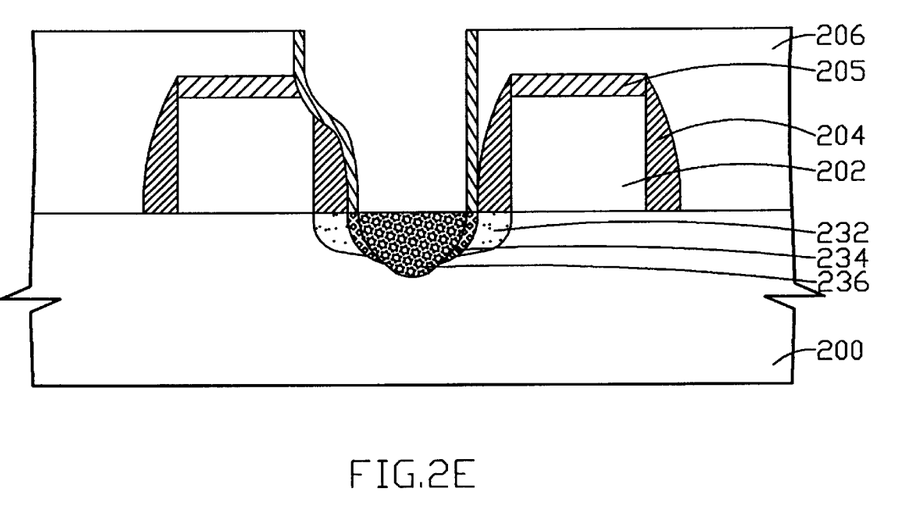

Once the liner formation is completed, implantation of the substrate 200 may be further done through the lined contact opening to form a third doping regions 234. Together with the previously doped first doping region 232 and second doping region 234, one resulting implantation profile is illustrated in FIG. 2(e). Finally the contact opening is ready for filling in with the desired conductive plug and the SAC process is then completed.

Figure 3A:
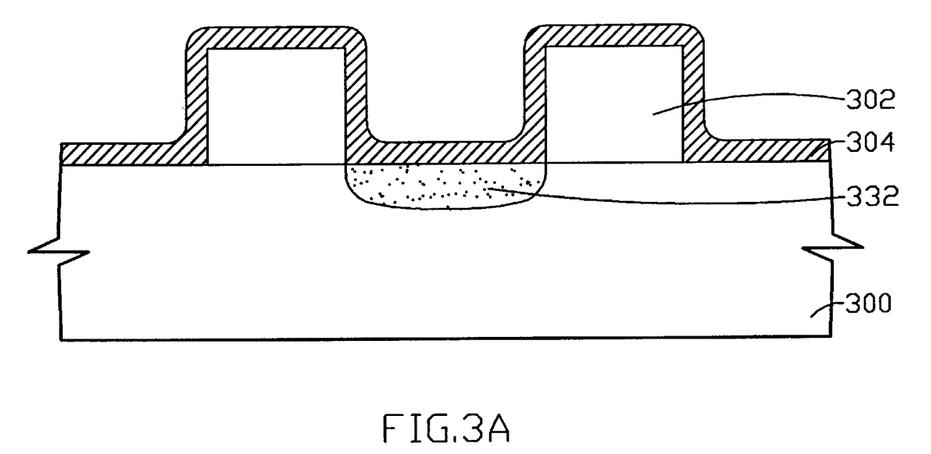
FIGS. 3a through 3e are cross-sectional views showing a sequence of steps for forming self-aligned contact according to another embodiment of the present invention.

FIGS. 3(a) to 3(e) represents another embodiment of the present invention. As shown in FIG. 3(a), conductive structures 302 are formed on a substrate 300. Masking by the structures 302, implantation may then be proceeded onto the substrate 300 to form first doping regions 332. After the implantation, the substrate, as well as the conductive structures, is deposited with a layer of protection layer 304. The thickness of the protection layer 304 resembles the thickness of a spacer applicable for the conductive structures 232. However, unlike the spacer formation, the deposited protection layer 304 would not be treated with any etching procedure before the contact hole formation. As clearly seen in the figure, the protection layer provides thicker, that means stronger, corner protection of the conductive structures than a conventional spacer. In addition, the protection layer can serve a similar etch stop effect like a cap layer yet without executing any cap layer formation steps. Furthermore, without spacer etching at the cell area, possible plasma damage is largely reduced. The elimination of the etching step and the cap layer formation also gives the advantages of process simplification. The preferred protection material is silicon nitride. However, other adequate dielectric material may also be chosen.

Figure 3B:
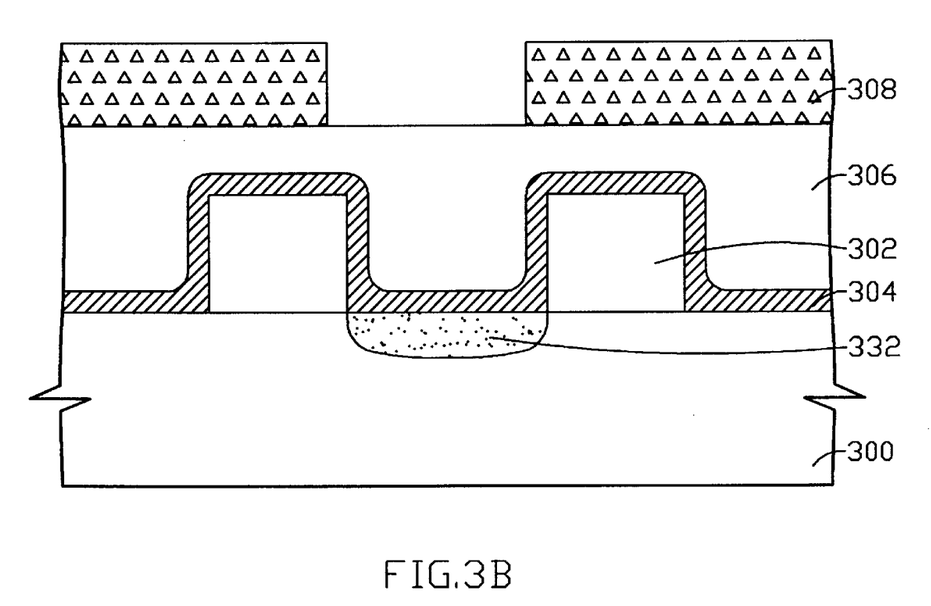
Figure 3C:
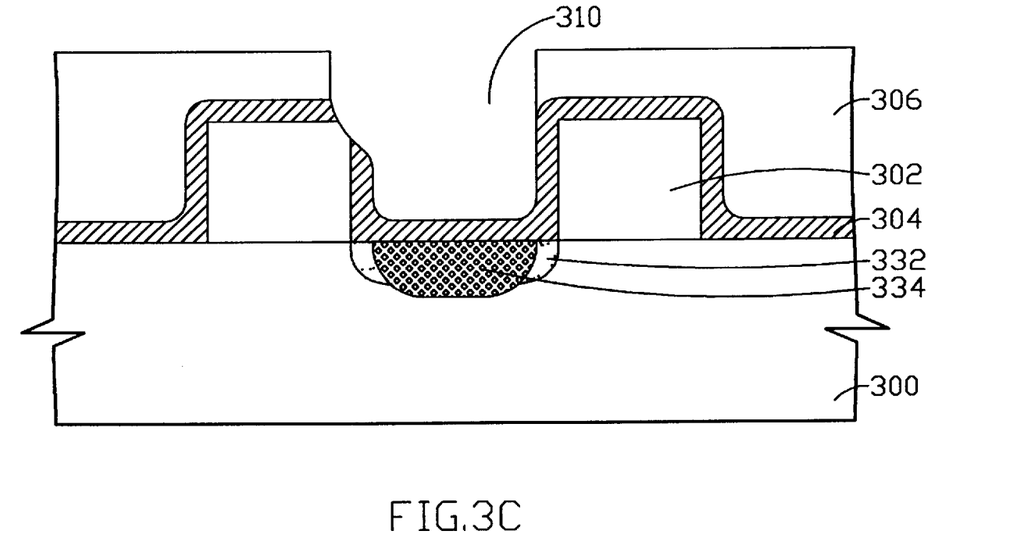
Figure 3D:
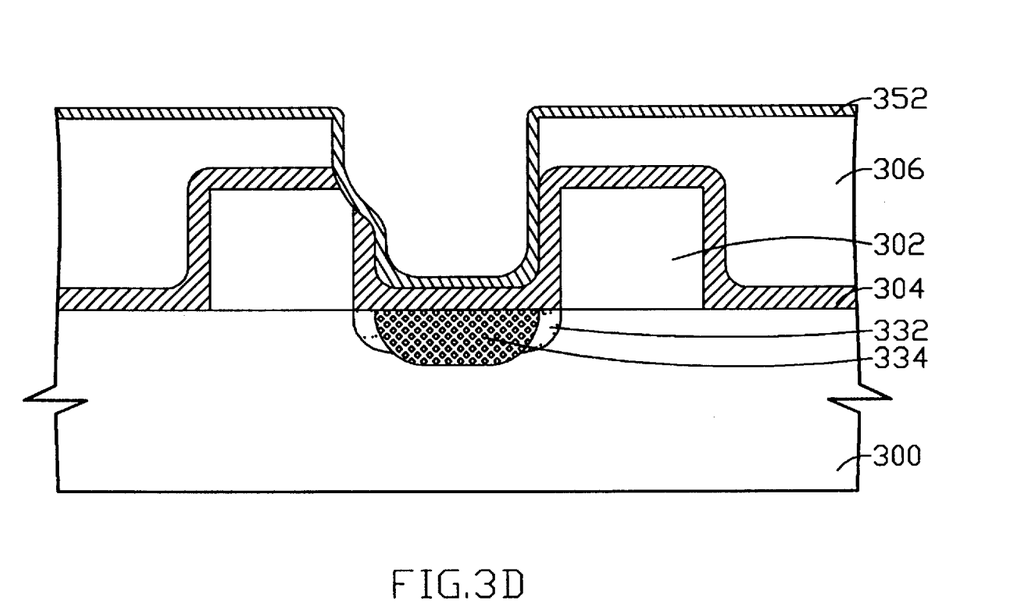

Followed by the protection layer 304 formation, an oxide layer 306 is formed over the substrate 300, as shown in FIG. (3b). Self aligning to the protection layer 304, a contact opening 310 is thus formed by etching back of the oxide layer 306 which is patterned by photoresist layers 308, as shown in FIG. 3(c). Upon completion of the SAC opening formation, the photoresist layers 308 are now removed. Then implantation of the substrate 300 may be further done through the contact openings 310 overlapping part of first doping regions 332 to form second doping regions 334.

The contact opening 310 is then coated with a conformal layer of dielectric liner 352, as shown in FIG. 2(d) The preferred liner material for the embodiment is silicon nitride, however, there may be other dielectric materials applicable. The dielectric liner 352 is typically deposited by low pressure chemical vapor deposition (LPCVD) to a feasible thickness according to the design requirements. Generally a thickness of about 200 angstroms of the liner 352 for a 17-micron cell would be reasonable.

Figure 3E:
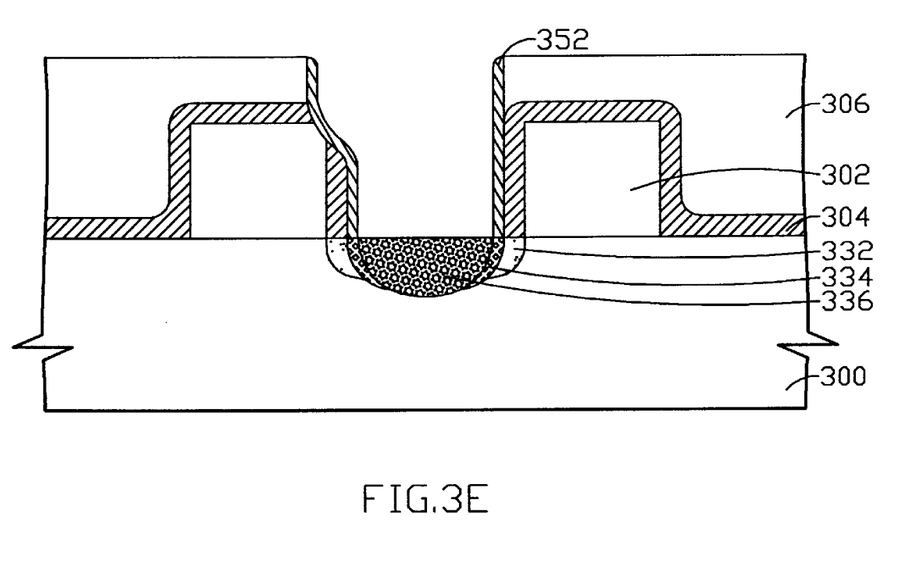

The dielectric liner 352 and the protection layer 304 are then etched back, typically by plasma etching back, to expose the substrate 300 and the top portion of the oxide layer 306, as indicated in FIG. 3(e). However, the etching should be conducted in such a way that the sidewall of the contact opening is still fully lined with dielectric(s) after the etching. After the etching back, the device is further treated with wet chemical to complete the contact opening formation.

Once the liner formation is completed, implantation of the substrate 300 may be further done through the lined contact openings to form third doping regions 334. Together with the previously doped first doping regions 332 and second doping regions 334, one resulting implantation profile is illustrated in FIG. 3(e). Finally the contact openings are filled with a conductive plug to complete the SAC process.

In view of the forgoing description, the benefits provided herein increase semiconductor product yield and reliability.

Although specific embodiments have been illustrated and described, it will be obvious to those skilled in the art that various modifications may be made without departing from what is intended to be limited solely by the appended claims.

What is claimed is:

1. A method for forming a self-aligned contact, comprising:
   providing a semiconductor substrate with at least two conductive structures forming thereon;
   forming a first implantation region of said semiconductor substrate masking by two adjacent said conductive structures;
   depositing a first insulating layer over the semiconductor substrate;
   depositing a second insulating layer over said first insulting layer;
   etching a portion of said second insulating layer to form a preparatory opening between said two adjacent conductive structures in a self-aligned manner;
   forming a second implantation region of said semiconductor substrate through said preparatory opening;
   depositing a third insulting layer conformally over said preparatory opening to form a contact opening;
   forming a third implantation region of said semiconductor substrate through said contact opening; and
   filling said contact opening with a conductive plug.

2. The method according to claim 1, wherein said conductive structures comprise polysilicon structures.

3. The method according to claim 1, wherein said first insulating layer comprises silicon nitride.

4. The method according to claim 1, wherein said second insulating layer comprises oxide.

5. The method according to claim 1, wherein said third insulating layer comprises a dielectric liner.

6. The method according to claim 5, wherein said dielectric liner is deposited to a thickness of about 200 angstroms for 0.17-micron DRAM cells.

7. The method according to claim 5, wherein said dielectric liner comprises a silicon nitride liner.

8. The method according to claim 1, wherein said third insulating layer is deposited by low pressure chemical vapor deposition (LPCVD).

9. A method for forming a self-aligned contact, comprising:
   providing a semiconductor substrate with at least two conductive structures forming thereon;
   forming a first implantation region of said semiconductor substrate masking by two adjacent said conductive structures;
   depositing a nitride layer over the semiconductor substrate;
   depositing an oxide layer over said nitride layer;
   etching a portion of said oxide layer to form a preparatory opening between said two adjacent conductive structures in a self-aligned manner;
   forming a second implantation region of said semiconductor substrate through said preparatory opening;
   depositing a silicon nitride liner conformally over said preparatory opening to form a contact opening; and
   forming a third implantation region of said semiconductor substrate through said contact opening.

10. The method according to claim 9, wherein said conductive structures comprise polysilicon structures.

11. The method according to claim 9, wherein said silicon nitride liner is deposited to a thickness of about 200 angstroms for 0.17-micron DRAM cells.

12. The method according to claim 9, wherein said silicon nitride liner is deposited by low pressure chemical vapor deposition (LPCVD).

13. A method for forming a self-aligned contact, comprising:
   providing a semiconductor substrate with at least two conductive structures forming thereon, wherein at least one spacer is formed on a lateral side of each said conductive structure;
   depositing an insulating layer over the semiconductor substrate;
   etching a portion of said insulating layer to form an opening between said two adjacent conductive structures in a self-aligned manner;
   depositing a dielectric liner conformally over said opening; and
   forming an implantation region in the semiconductor substrate after the dielectric liner formation.

14. The method according to claim 13, wherein said conductive structures comprise polysilicon structures.

15. The method according to claim 13, wherein said spacer comprises silicon nitride.

16. The method according to claim 13, wherein said insulating layer comprises oxide.

17. The method according to claim 13, wherein said dielectric liner comprises silicon nitride.

* * * * *